(12) United States Patent
Kasahara

(10) Patent No.: US 7,847,324 B2
(45) Date of Patent: Dec. 7, 2010

(54) MOS TRANSISTOR AND SEMICONDUCTOR INTEGRATED CIRCUIT

(75) Inventor: Masaki Kasahara, Tama (JP)

(73) Assignee: Mitsumi Electric Co., Ltd., Tokyo (JP)

( * ) Notice: Subject to any disclaimer, the term of this patent is extended or adjusted under 35 U.S.C. 154(b) by 238 days.

(21) Appl. No.: 12/336,785

(22) Filed: Dec. 17, 2008

(65) Prior Publication Data

US 2009/0166756 A1 Jul. 2, 2009

(30) Foreign Application Priority Data

Dec. 28, 2007 (JP) ............................. 2007-340832

(51) Int. Cl.
*H01L 29/76* (2006.01)
*H01L 21/70* (2006.01)

(52) U.S. Cl. ............... 257/288; 257/390; 257/E29.345; 365/72

(58) Field of Classification Search ................. 257/288, 257/390, E29.345; 365/72
See application file for complete search history.

(56) References Cited

U.S. PATENT DOCUMENTS 7,623,384 B2 * 11/2009 Iwata .................... 365/185.17
7,759,720 B2 * 7/2010 Arigane et al. .............. 257/314
2007/0262390 A1 * 11/2007 Ishida et al. ................ 257/368

FOREIGN PATENT DOCUMENTS

JP 10-012824 1/1998

* cited by examiner

*Primary Examiner*—Lex Malsawma
(74) *Attorney, Agent, or Firm*—IPUSA, PLLC

(57) ABSTRACT

A MOS transistor includes plural transistor cell blocks arranged adjacently in parallel to one another, wherein the plural transistor cell blocks are configured to have plural transistor cells, plural boundaries that are parallel to the plural transistor cells, and plural back gates arranged at the plural boundaries, each of the plural transistor cell blocks has two boundaries of the plural boundaries, wherein the plural transistor cells have a substantially striped shape, and each of the plural transistor cell blocks includes: at least one drain; plural sources; and plural extended gates, wherein each of the plural transistor cells is formed from one of the plural extended gates sandwiched by one of at least one drain and one of the plural sources, one of the plural sources is adjacent to one of two boundaries, and another one of the plural sources is adjacent to another one of two boundaries.

6 Claims, 6 Drawing Sheets

MOS TRANSISTOR AND SEMICONDUCTOR INTEGRATED CIRCUIT

BACKGROUND OF THE INVENTION

1. Field of the Invention

The present invention generally relates to MOS (Metal Oxide Semiconductor) transistors and semiconductor integrated circuits incorporating the MOS transistors, and more specifically, to MOS transistors provided with a plurality of substantially stripe shaped transistor cells in which each of the plural transistor cells is configured to have an extended gate that is sandwiched between an extended source and an extended drain, and to semiconductor integrated circuits incorporating the MOS transistors.

2. Description of the Related Art

Conventionally, there is known a transistor configuration technique in which plural transistor cells are formed on a semiconductor substrate to form a single MOS (Metal Oxide Semiconductor) transistor. In this case, a transistor cell includes an extended gate electrode (gate), a drain electrode (drain) and a source electrode (source), and the drain and the source are formed to sandwich the gate and are extended in a striped shape approximately parallel to the gate. The source and the drain are alternately arranged in plural transistor cells.

FIGS. 1A through 1C are drawings showing a structure of a related art MOS transistor Tr1. FIG. 1A shows a metal layer M1 capable of applying voltage to the MOS transistor Tr1. FIG. 1B shows a plan view of the structure of the MOS transistor Tr1 formed on a semiconductor substrate WF, and FIG. 1C is a cross sectional view of the structure of the MOS transistor Tr1. Each part of the above structure is correspondingly referenced in the above mentioned figures.

In FIG. 1B, a single transistor cell is formed from an extended gate G1, a drain D and a source S, in which the drain D and the source S are arranged at both sides of the extended gate G1. The number of the formed transistor cells is the same as that of the gate G1, and these transistor cells are arranged to be connected in parallel to form a single MOS transistor Tr1.

Further, two sources S are arranged at both sides of the arranged transistor cells, and back gates BG1 are formed around the perimeter of the arranged transistor cells. Generally, identical electric potential (voltage) is applied to the sources S and the back gates BG1. For an N channel MOS transistor, ground potential is applied to the sources S and the back gates BG1. The electric potential of a power supply is applied to the drains D. Further, through holes H are formed on the drains D, the sources S and the back gates BG1 to allow an electrical connection to the metal layers formed as upper layers.

FIG. 1A shows the structure of a metal layer M1 which applies electric potential to the MOS transistor Tr1. In order to apply the ground potential to the sources S and the back gates BG1, a ground potential supply pattern MG1 is formed to cover the sources S and the back gates BG1. On the other hand, for applying power supply potential to the drains D, a power supply pattern MV1 is formed to cover the drains D. The metal layer M1 applies electric potential to the MOS transistor Tr1 through the through holes H described above.

In FIG. 1C, a cross sectional structure of the MOS transistor Tr1 of FIG. 1B is shown. The sources S and drains D are formed at the surface of the semiconductor substrate WE as N-type diffusion layers which are arranged at the surface at a predetermined interval. Oxide insulating films I are formed on the semiconductor substrate WF located between the N-type diffusion layers, and gates are formed on the oxide insulating films. The semiconductor substrate WF is formed with a P-type layer, while the source S and drain D are formed with N-type diffusion layers. These layers form parasitic NPN type transistors Q1 in the semiconductor substrate WF. A drain D, a source S and a P-type layer of the semiconductor substrate WF respectively correspond to a collector, an emitter and a base of a parasitic transistor Q1. In this case, there is a substrate resistance R1 that is formed between the back gate BG1 having the ground potential and the base of the parasitic transistor Q1. The resistance corresponds to that of the semiconductor substrate WF, and thus the resistance becomes greater by increasing the distance between the base and the end of the back gate BG1 to which ground potential is applied. Therefore, in FIG. 1C, a base resistance R1 of the parasitic transistor Q1 formed at the central part of the semiconductor substrate WF becomes the highest value.

Here, when the base resistance R1 between the base of the parasitic transistor Q1 and the ground becomes greater, the base electric potential tends to become higher. As a result, the parasitic transistor Q1 enters a turned-on state and electric current flows between the emitter and the collector causing a breakdown. That is, a snapback phenomenon can easily occur. Once a snapback phenomenon occurs, an uncontrollable electric current starts flowing between the drain D and source S. In order to prevent this, conventionally, a technique is suggested to increase the gate length of a gate G for improving the breakdown voltage characteristics of a MOS transistor.

FIGS. 2A through 2C are drawings showing a structure of a related art MOS transistor Tr2 which has a longer gate length. FIG. 2A shows a metal layer M2 which applies electric potential to a MOS transistor Tr2, FIG. 28 shows a plan view of a structure of the MOS transistor Tr2 formed on the semiconductor substrate WF, and FIG. 2C is a drawing showing a cross sectional structure of the MOS transistor Tr2. It is indicated that the arrangement of individual parts correspond through the figures. Further, the same reference symbols are used for identical parts of the configuration used in FIG. 1.

In FIG. 2B, each source S and each drain D are arranged at both sides of each gate G2 that is extended in a line shape. The source and drain are arranged to sandwich each gate G2 approximately in parallel to the extended gate G2. Plural transistor cells are formed and two sources S are arranged at both sides of the plural transistor cells. The back gate BG1 surrounds the transistor cells. The basic configuration in which the back gate BG1 is formed around the perimeter of the sources S is similar to FIG. 1B except that the gate G2 has a longer gate length, which is different from FIG. 1B.

FIG. 2C shows a cross sectional view of the MOS transistor TR2 corresponding to the MOS transistor TR2 in FIG. 2B. In this case, there is an NPN-type parasitic transistor Q2 formed of a drain D and source S of N-type diffusion layers, and a P-type layer of the semiconductor substrate WF. A substrate resistance R1 is formed between the base of the parasitic transistor Q2 and a back gate BG1 similar to the case of FIG. 1C. In this case, the breakdown voltage characteristic of the parasitic transistor Q2 is improved because the gate length of the gate G2 has been increased. Thus it becomes more difficult to cause a snapback phenomenon, as compared to the case of FIG. 1C.

FIG. 2A shows a structure of a metal layer M2 formed on an upper layer of the MOS transistor Tr2. The metal layer M2 includes a ground potential supply pattern MG2 and a power potential supply pattern MV2. In FIG. 2A, the ground potential supply pattern MG2 is formed to continuously cover the source S and the back gate BG1 so that the ground potential can be applied to the source S and the back gate BG1. The power potential supply pattern MV2 is formed to cover the drain D so that the power supply potential can be applied to the drain D. These features are similar to the case of FIG. 1A, however, the gate length L of the gate G2 has been increased and the width of the ground potential supply pattern MG2 has been increased to correspond to the increased gate length L. As a result, the fact that the separation of the power potential supply pattern MV2 has been increased is a different point from the case of FIG. 1A.

As described above, conventionally, a desired breakdown voltage characteristic is achieved by increasing the gate length L, in which the gate length L is determined by the required breakdown voltage of a MOS transistor Tr2.

Further, there is a related technique that prevents the transistors of a protection circuit from degradation of the breakdown voltage characteristics. In this case, the semiconductor apparatus includes a transistor formed in a single conducting type well region, in which the conducting regions of a source and drain are opposite to that of the well and the source and drain are formed to sandwich a gate electrode. Also a back gate region with a single conducting type is arranged on the surface of the source region and penetrates the source region to the single conducting type well region. The position of the back gate region at the surface of the source region is arranged to maximize the resistance between a position right below the gate in the well region and the back gate region (for example, Japanese Patent Application Publication No. 10-12824).

However, in the configuration of the related technique described above in FIG. 2, when the gate length L is lengthened without changing the gate width, the gate capacitance increases as the gate area is increased with the gate length. This causes a problem in that the MOS transistor Tr2 can operate at high speed.

Further, when the current driving capability of the MOS transistor Tr2 needs to be constant, the gate width must be widened to prevent the degradation of the current driving capability caused by lengthening the gate length. Thus, the gate area and the device area increase with the gate width, and eventually, the gate capacitance and the parasitic capacitance of the source and drain are increased. As a result, the parasitic capacitance prevents the MOS transistor Tr2 from providing required characteristics, and thus high breakdown voltage characteristics and high speed switching operation cannot be achieved at the same time.

FIG. 3 shows the gate length dependence of snapback voltages and gate capacitances (parasitic capacitances), in which the MOS transistor Tr2 has been manufactured with a related art technique shown in FIG. 2 to improve the breakdown voltage characteristics. In FIG. 3, a chain line indicates a gate capacitance (parasitic, capacitance) characteristic for different gate lengths L and a dashed line indicates snapback voltages for different gate lengths L.

As shown in FIG. 3 with the dashed line, the snapback voltage increases linearly as the gate length L is increased, resulting in the improvement of the breakdown voltage characteristics. However, since the gate parasitic capacitance is drastically increased in a quadratic function manner as indicated by the chain line, it is difficult to increase the breakdown voltage characteristics when providing high speed operations.

It is, therefore, one of the objects of this invention is to provide an improvement of the breakdown voltage characteristics of a MOS transistor capable of operating high speed switching, and to provide semiconductor integrated circuits incorporating the MOS transistor.

SUMMARY OF THE INVENTION

Accordingly, embodiments of the present invention may provide a novel and useful way to solve one or more of the problems discussed above. More specifically, the embodiments of the present invention may provide a MOS transistor including plural transistor cell blocks arranged adjacently in parallel to one another, wherein the plural transistor cell blocks are configured to have plural transistor cells, plural boundaries that are parallel to the plural transistor cells, and plural back gates arranged at the plural boundaries, each of the plural transistor cell blocks has two boundaries of the plural boundaries, wherein the plural transistor cells have a substantially striped shape, and each of the plural transistor cell blocks includes: at least one drain; plural sources; and plural extended gates, wherein each of the plural transistor cells is formed from one of the plural extended gates sandwiched by one of at least one drain and one of the plural sources, one of the plural sources is adjacent to one of two boundaries, and another one of the plural sources is adjacent to another one of two boundaries.

Other objects, features, and advantages of the present invention will become more apparent from the following detailed description when read in conjunction with the accompanying drawings.

BRIEF DESCRIPTION OF THE DRAWINGS

FIG. 1A is a drawing showing a metal layer M1 for supplying electric potential to the MOS transistor Tr1;

FIG. 1B is a drawing showing a plan view of a structure of the MOS transistor Tr1;

FIG. 1C is a drawing showing a cross sectional structure of the MOS transistor Tr1;

FIG. 2A is a drawing showing a metal layer M2 for supplying electric potential to the MOS transistor Tr2;

FIG. 2B is a drawing showing a plan view of a structure of the MOS transistor Tr2;

FIG. 2C is a drawing showing a cross sectional structure of the MOS transistor Tr2;

FIG. 4A is a drawing showing a plan view of a structure of a metal layer M for supplying electric potential to the MOS transistor Tr;

FIG. 4B is a drawing showing a plan view of a structure of the MOS transistor Tr;

FIG. 4C is a drawing showing a cross sectional structure of the MOS transistor Tr;

DETAILED DESCRIPTION OF THE PREFERRED EMBODIMENTS

A description is given below, with reference to the figures, of embodiments of the present invention.

Figure 4A:
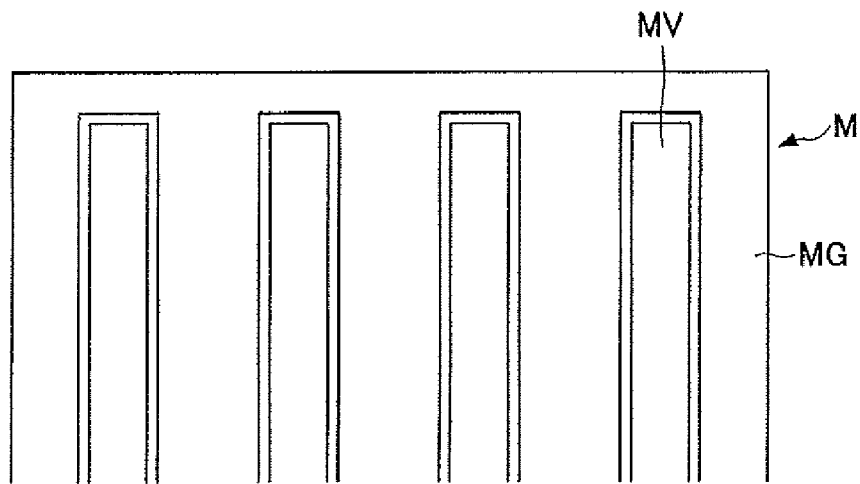
FIGS. 4A through 4C show a structure of a MOS transistor of the present embodiment.
Figure 4B:
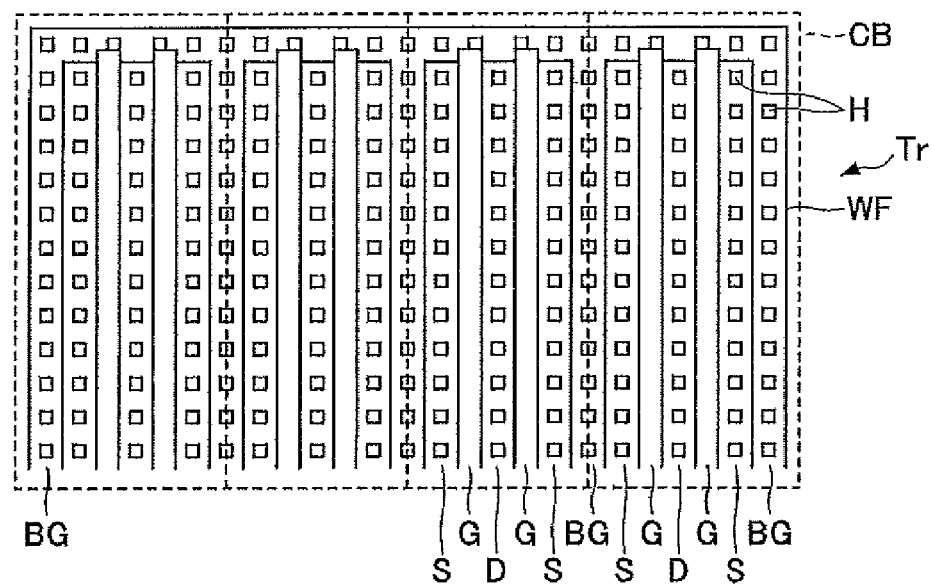
Figure 4C:
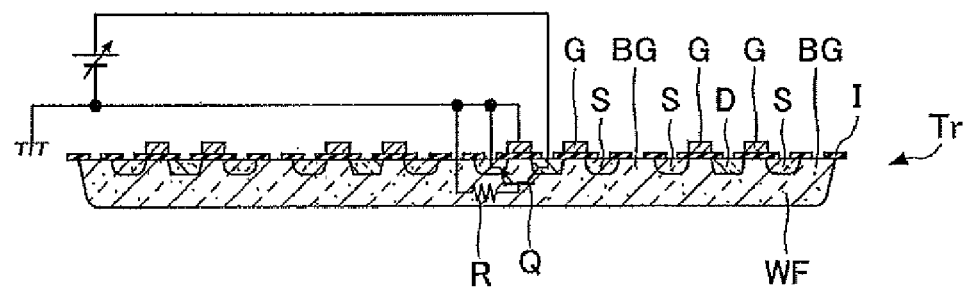

FIGS. 4A through 4C show a structure of a MOS transistor Tr of the present embodiment. FIG. 4A is a drawing showing a plan view of a structure of a metal layer M for supplying electric potential to the MOS transistor Tr. FIG. 4B is a drawing showing a plan view of a structure of the MOS transistor Tr, and FIG. 4C is a drawing showing a cross sectional structure of the MOS transistor Tr. Each part of the MOS transistor Tr is correspondingly shown in FIGS. 4A-4C. Further, although the MOS transistor of the present embodiment is preferably applied to a power transistor, this transistor may also be applied to other types of MOS transistor.

FIG. 4B is a drawing showing a plan view of the MOS transistors Tr of the present embodiment. The MOS transistor Tr of the present embodiment is formed on a semiconductor substrate WF. In the MOS transistor Tr of the present embodiment, a drain D and a source S are arranged in a striped shape manner approximately parallel to an extended gate G at both sides of the gate G which is extended in a line shape. In other words, the extended gate G is sandwiched by the drain D and the source S. A transistor cell is configured to have a gate and a pair of a source and a drain that are arranged at both sides of the gate. Also, for two adjacent transistor cells, a single drain is commonly used, so that the sources and drains are alternately arranged (See FIG. 4B). The number of the transistor cells is the same as that of the gates G. In FIG. 4B, eight of the gates G are shown, meaning that eight transistor cells exist. In this manner, the MOS transistor of the present embodiment includes plural stripe-shaped transistor cells.

Further, the MOS transistor of the present embodiment includes plural transistor cell blocks CB arranged adjacently in parallel to one another. In FIG. 4B, the MOS transistor Tr includes four transistor cell blocks. A transistor cell block CB has plural boundaries and plural transistor cells, in which the plural transistor cells are arranged between two boundaries of the transistor cell block CB in parallel to the boundaries, and back gates BG are arranged at the boundaries. The plural transistor cells include at least one drain D, plural sources S, and plural extended gates G. Each of the plural transistor cells is formed from one of the plural extended gates sandwiched by one of at least one drain and one of the plural sources, and one of the plural sources is adjacent to one of the two boundaries and another one of the plural sources is adjacent to another one of the two boundaries. As for the configuration of each transistor cell block, two sources are arranged at both sides of each transistor cell block. Also, two back gates BG are arranged at the outsides of the two sources, forming boundaries of the cell block. From a different perspective, when viewing two adjacent transistor cell blocks and a back gate at the boundary, it can be seen that the back gate at the boundary is sandwiched by two sources of the adjacent transistor cell blocks.

In this manner, in the MOS transistor Tr of the present embodiment, the back gates are arranged not only at both sides of the MOS transistor Tr but also at the inside of the MOS transistor Tr with a predetermined interval. This can reduce the distance between the back gates BG. The back gates BG are generally connected to a ground, and when a substrate current is generated at a central part of the transistor cell block CB, the substrate current can flow through the back gates BG existing at both sides of the transistor cell block CB.

Also, the MOS transistor Tr may include a pair of surrounding back gates. One of the surrounding gates is shown in FIG. 4B (another one of the surrounding back gates is not shown in FIG. 4B). Each of the plural back gates has two ends (for example, a first end and a second end). One of the surrounding back gates connects all the first ends of the plural back gates as shown in FIG. 4B, and another one of the surrounding back gates connects all the opposite ends (not shown) of the plural back gates so that each of the plural transistor cell blocks is surrounded by the plural back gates and the pair of the back gates. In this way, the back gates BG may include not only parts which are formed in a direction (an extended direction of the transistor cell block CB) being the same direction as a striped shape of a transistor cell but also other parts which are formed in an approximately perpendicular direction to the striped shape direction to surround the ends of the transistor cell. In this manner, the back gates BG can be connected to each other in an ensured manner, which can provide a uniform potential supply throughout the entire MOS transistor Tr. In FIG. 4B, although only one side of the back gates BG at one end of the transistor cell is shown, the opposite side of the back gates BG also surrounds the opposite end of the transistor cell.

Through holes H may be formed above the drains D, the sources S and the back gates BG. There is a metal layer M formed on the through holes H. The metal layer is electrically connected to the MOS transistor Tr via the through holes and electric potentials are supplied to the MOS transistor Tr via the through holes H.

FIG. 4A is a drawing showing a plan configuration of a metal layer formed on a MOS transistor Tr. In FIG. 4A, the metal layer M includes a ground potential supply pattern MG supplying ground potential and a power potential supply pattern MV supplying the power supply potential. Since the ground potential is supplied to the sources S and the back gates BG of the MOS transistor Tr, the ground potential supply pattern MG is formed to cover the through holes H formed on the sources S and the back gates BG. Further, the power supply potential is supplied to the drains D of the MOS transistor Tr, and the power potential supply pattern MV is formed to cover the through holes H formed on drains D. The ground potential supply pattern MG is connected to ground, and the electric current collected from the sources S and the back gates BG of the MOS transistor Tr flows to the ground. On the other hand, the power potential supply pattern MV is connected to a power supply and supplies a current from the power supply to the drains D.

FIG. 4C is a drawing showing a cross sectional structure of the MOS transistor Tr of the present embodiment. In FIG. 4C, the sources S and drains D are formed on the surface of the semiconductor substrate WF. The semiconductor substrate WF is formed by a P-type layer, and the sources S and drains D are formed by N-type diffusion layers. Namely, the MOS transistor Tr of the present embodiment is used for an N-channel MOS transistor. Further, the P-type layer may be a P-Well layer or a P-type epitaxial layer formed in the semiconductor substrate WF.

On the surface of the semiconductor substrate WF, an oxide insulating film I is formed. The oxide insulating film I includes holes at positions corresponding to the through holes H to allow electrical connection with the through holes. Further, gates G are formed on the oxide insulating film I that is located between the sources S and the drains D.

Further, the back gates BG are arranged between adjacent transistor cell blocks CB (arranged at boundaries of the transistor cell blocks CB) and at both sides of the whole MOS transistor Tr. As a result, in FIG. 4C, a total of five rows of back gates BG are formed in a substantially parallel-line shaped manner, in which two back gates BG are arranged at both sides of the whole MOS transistor Tr and three back gates BG are arranged at the inside of the whole MOS transistor Tr. The back gate BG may be formed by the P-type layer of the semiconductor substrate WF or another P-type layer which is formed differently from the P-type layer of the semiconductor substrate WF. In FIG. 4C, no boundary is shown between the back gates BG and the P-type layer of the semiconductor substrate WF because the P-type layer of the semiconductor WF is used as the back gates BG. Further, the P-type layer of the semiconductor substrate WY may be a P-well layer or a P-type epitaxial layer, as described above.

In FIG. 4C, a parasitic transistor Q is formed at a central part of the MOS transistor. The drain D formed by an N-type diffusion layer corresponds to a collector and the source S corresponds to an emitter. Since the semiconductor substrate WF is formed by a P-type layer, the parasitic transistor Q is configured as an NPN type transistor. The back gate BG forms a ground, which is connected to the base of the NPN parasitic transistor Q via a parasitic resistance R (on resistance). When the parasitic resistance R is high, the base potential can be easily raised, resulting in easily switching the parasitic transistor Q on, that is, a phenomenon called snapback tends to occur. However, in the case of the MOS transistor of the present embodiment, the parasitic resistance R becomes low because the distance between the base of the parasitic transistor Q and the back gate supplying a ground potential is short. Thus, the base potential is hardly raised, which tends to prevent the snapback phenomenon. Further, since the gate length L of the gate G is not increased, the operational speed of the MOS transistor Tr is not reduced.

In this manner, the back gates BG connected to the ground potential are formed not only at both sides of the MOS transistor Tr but also between the transistor cell blocks CB (at the boundary of adjacent transistor cell blocks CB). As a result, the back gates BG are provided within the MOS transistor Tr, which reduces the parasitic resistance R. With this, a substrate current can be immediately collected by a back gate BG which is close to a part where the substrate current is generated, so that the substrate current can flow out through the ground potential supply pattern MG of the mental layer M. Further, since the gate length L of the MOS transistor Tr is not changed (lengthened), the MOS transistor TR can maintain the high speed operation and improve its breakdown voltage characteristics.

In FIG. 4C, although only a single parasitic transistor Q is focused, two parasitic NPN transistors Q are formed in each transistor cell block CB. For each parasitic NPN transistors Q, the parasitic resistance R can be reduced by the back gates BG, so that the substrate current can be collected by the back gate BG near each parasitic transistor Q.

Further, in FIGS. 4A-4C, it is described as an example that each transistor cell block includes two transistor cells and the back gates BG are provided at both sides of the MOS transistor Tr and between transistor cell blocks CB. This configuration is preferred because two back gates BG are provided for two transistor cells, which can improve the breakdown voltage characteristics of the MOS transistor Tr maintaining its high speed operation.

Figure 1A:
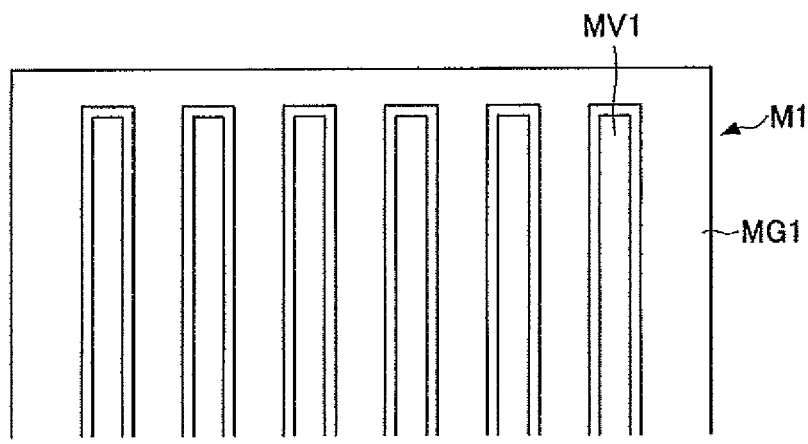
FIGS. 1A through 1C show a structure of a related art MOS transistor Tr1.
Figure 1B:
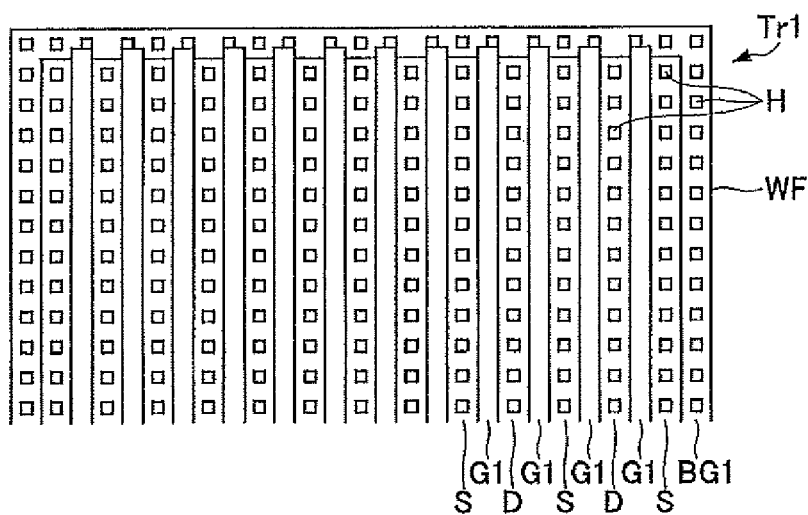
Figure 1C:
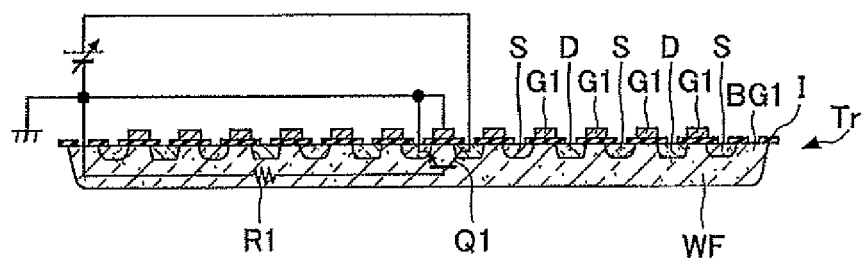
Figure 2A:
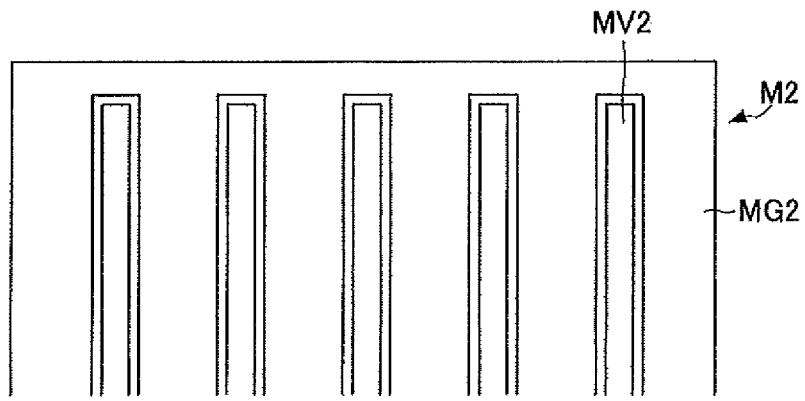
FIGS. 2A through 2C are drawings showing views of a structure of a related art MOS transistor Tr2 having longer gate length.
Figure 2B:
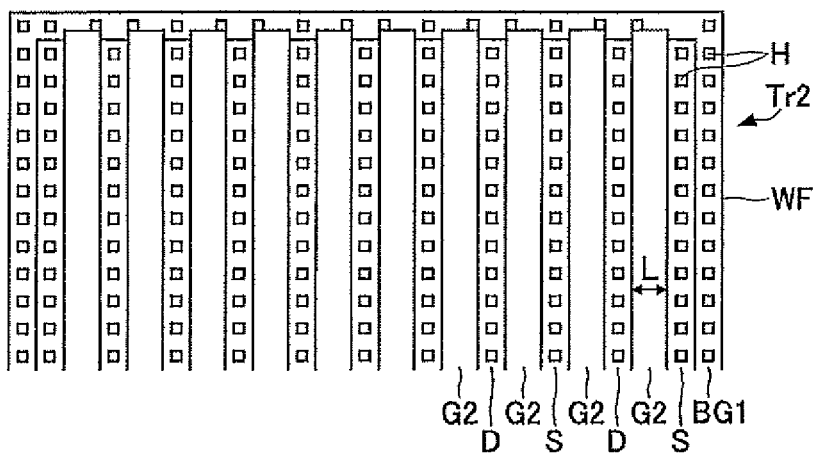
Figure 2C:
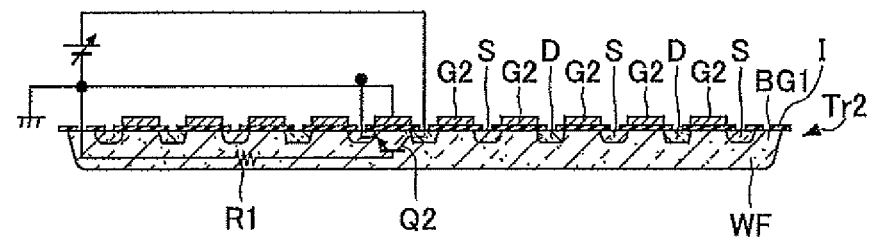
Figure 3:
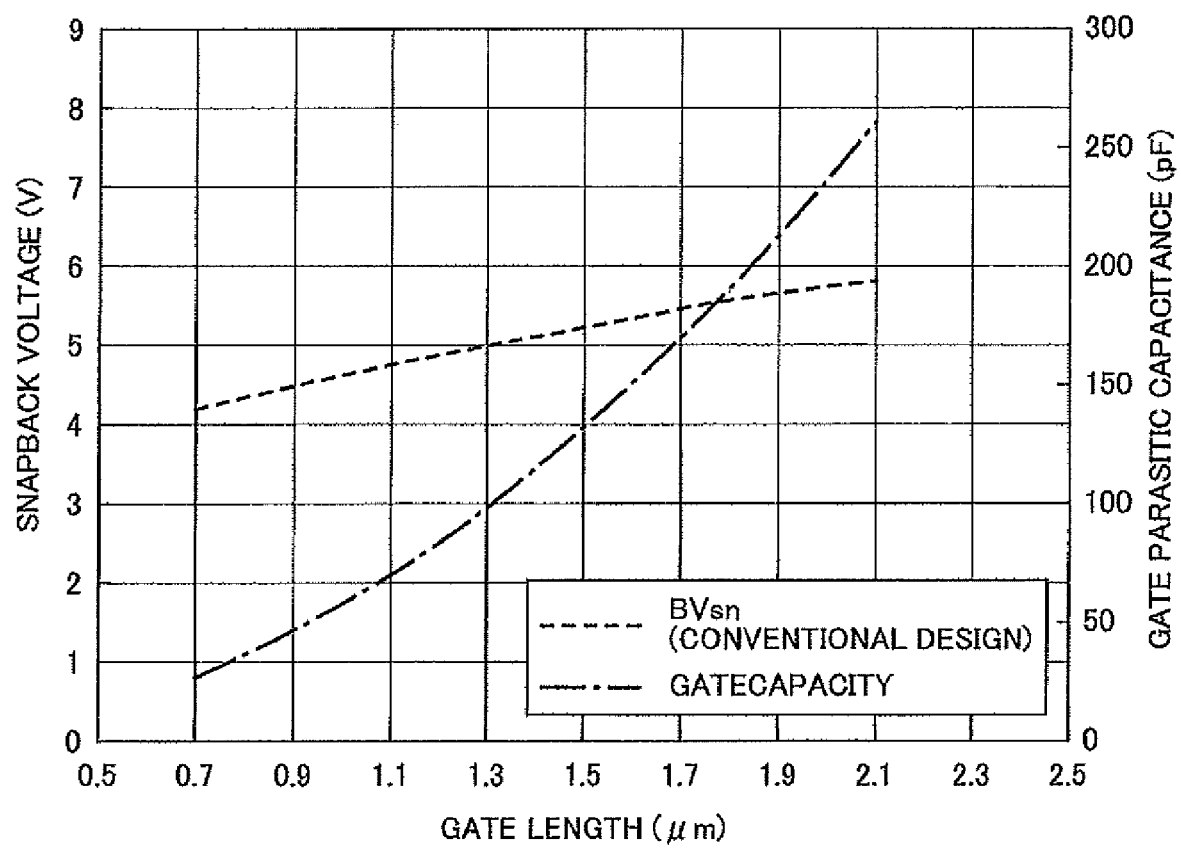
FIG. 3 shows the gate length dependence of snapback voltages and gate capacitances (parasitic capacitances), in which the MOS transistor Tr2 has been manufactured by the related art technique shown in FIG. 2 to improve the breakdown voltage characteristics.

On the other hand, as for the MOS transistor Tr of the present embodiment, back gates BG are arranged as part of transistor cell blocks having striped shapes, in which each back gate BG is arranged at boundaries of two adjacent transistor cell blocks. In this case, for a given area, the number of transistor cells of the present embodiment can be less than that of the related art MOS transistor which does not improve the breakdown characteristics (see FIG. 1).

Then, if there is a limitation of the area of a MOS transistor Tr, and if a smaller area is given for a constant number of transistor cells, then the back gates provided the inner area of the MOS transistor may be reduced by a few to increase transistor cells in a single transistor cell block CB. For example, when the number of transistor cells per transistor cell block CB needs to be increased for a next level of integration of the MOS transistor Tr of FIG. 4, each transistor cell block CB can be configured to have four transistor cells. In this case, since two sources S need to be arranged at both sides of each transistor cell block CB, two transistor cells are added to each transistor cell block for every further increase in level of integration of the MOS transistor Tr, When the transistor cells per transistor cell block CB is increased as described above, the breakdown voltage characteristic of the MOS transistor Tr can be reduced compared to the case of the embodiment shown in FIG. 4. However, when comparing with another MOS transistor Tr having back gates BG only at both sides of the MOS transistor, this MOS transistor Tr can be substantially improved for the breakdown characteristics, since this MOS transistor Tr includes back gates BG around the inner area and both sides of the MOS transistor Tr. Further, according to a requirement of use and a permissible area for a MOS transistor Tr, transistor cell blocks having only two transistor cells per transistor cell block may be partially provided with other transistor blocks that include four or more than four transistor cells per transistor cell block. Likewise, other variations of transistor cell blocks CB may be combined to provide the MOS transistor Tr of the present embodiment.

Further, each transistor cell block CB may be configured to have the same number of transistor cells. Thus, it is possible to obtain uniform characteristics for each transistor cell block. This provides effective use for a given area of the semiconductor substrate WF.

As described above, the MOS transistor Tr including plural transistor cells is divided into transistor cell blocks in which two sources S are arranged at both sides of each transistor cell block CB, and the back gates BG are arranged at boundaries of each transistor cell block CB. This configuration allows arrangement of the back gates BG inside of the MOS transistor Tr. Thus, the breakdown voltage characteristic of each transistor cell block can be improved while maintaining high speed operation. Also, as for the entire MOS transistor Tr, the breakdown voltage characteristic can be improved while maintaining high speed operation. Further, the transistor cell block CB may be configured to use the variations described above.

Figure 5:
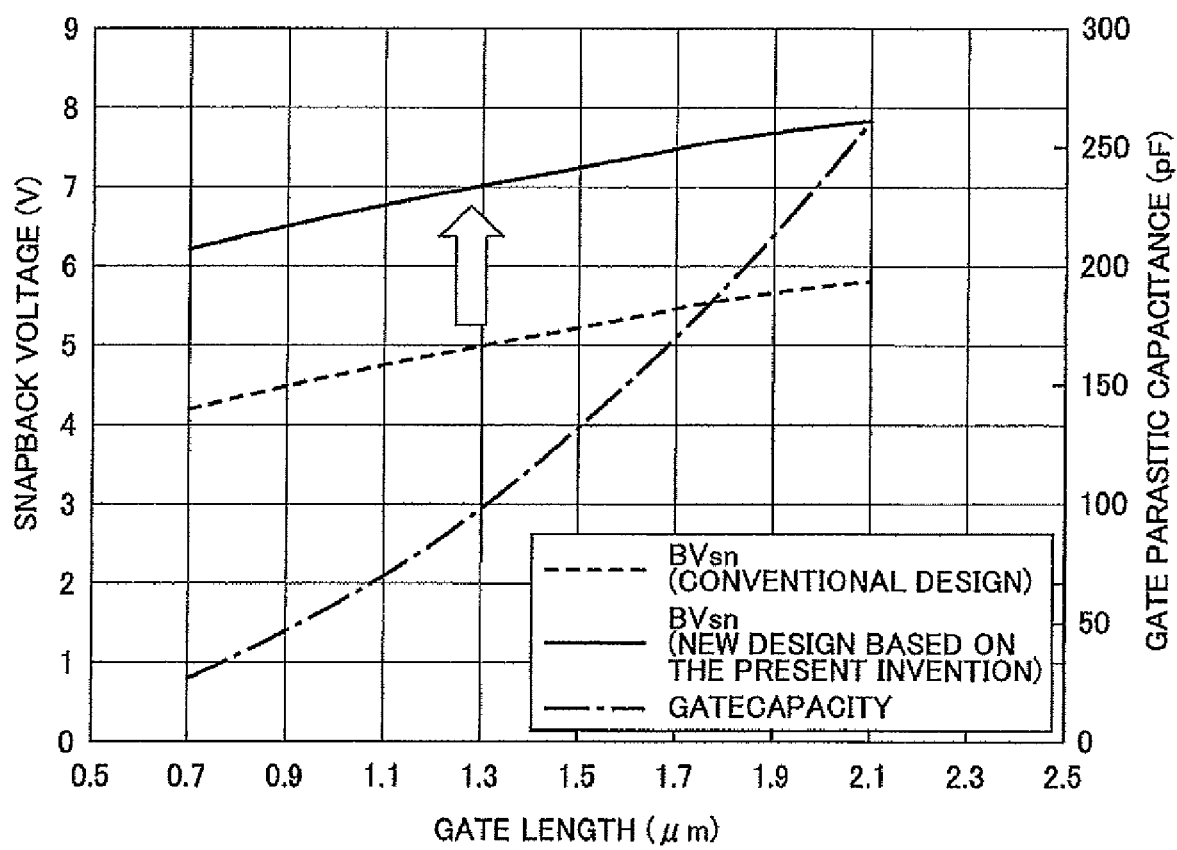
FIG. 5 shows the gate length L [μm] dependence of snapback voltages [V] and gate capacitances (parasitic capacitances) [pF] for a MOS transistor Tr of the present embodiment and a related art method.

FIG. 5 shows the relationships between the gate length L [μm] and the snapback voltage [V] and between the gate length L [μm] and the gate capacitance (parasitic capacitance) [pF] for a related art transistor Tr1 (see FIG. 1) and a MOS transistor Tr of the present embodiment. In FIG. 5, a dashed line shows the relationship between the gate length L of the related art MOS transistor Tr1 and the snapback voltage V, and a solid line shows the relationship between the gate length L of the MOS transistor Tr of the present embodiment and the snapback voltage V.

In FIG. 5, when the dashed line and the solid line are compared, the snapback voltage of the MOS transistor Tr of the present embodiment is higher than that of the related art MOS transistor Tr1 for the same gate length. This indicates that the breakdown voltage characteristic of the MOS transistor Tr1 of the present embodiment is improved. Further, the data of FIG. 5 indicate measurement data of power transistors having a parasitic resistance of approximately 500 [mΩ].

Further, in FIG. 5, the relationship between gate capacitances (parasitic capacitances) for gate lengths is shown with a chain line. The gate parasitic capacitance increases rapidly as a function of the gate length L in approximately a quadratic function curved manner. As the MOS transistor Tr of the present embodiment is configured by which the gate length L is not increased while the cell size of each transistor is maintained constant, the gate parasitic capacitance is not increased and the MOS transistor can operate with a designed operational speed.

Figure 6:
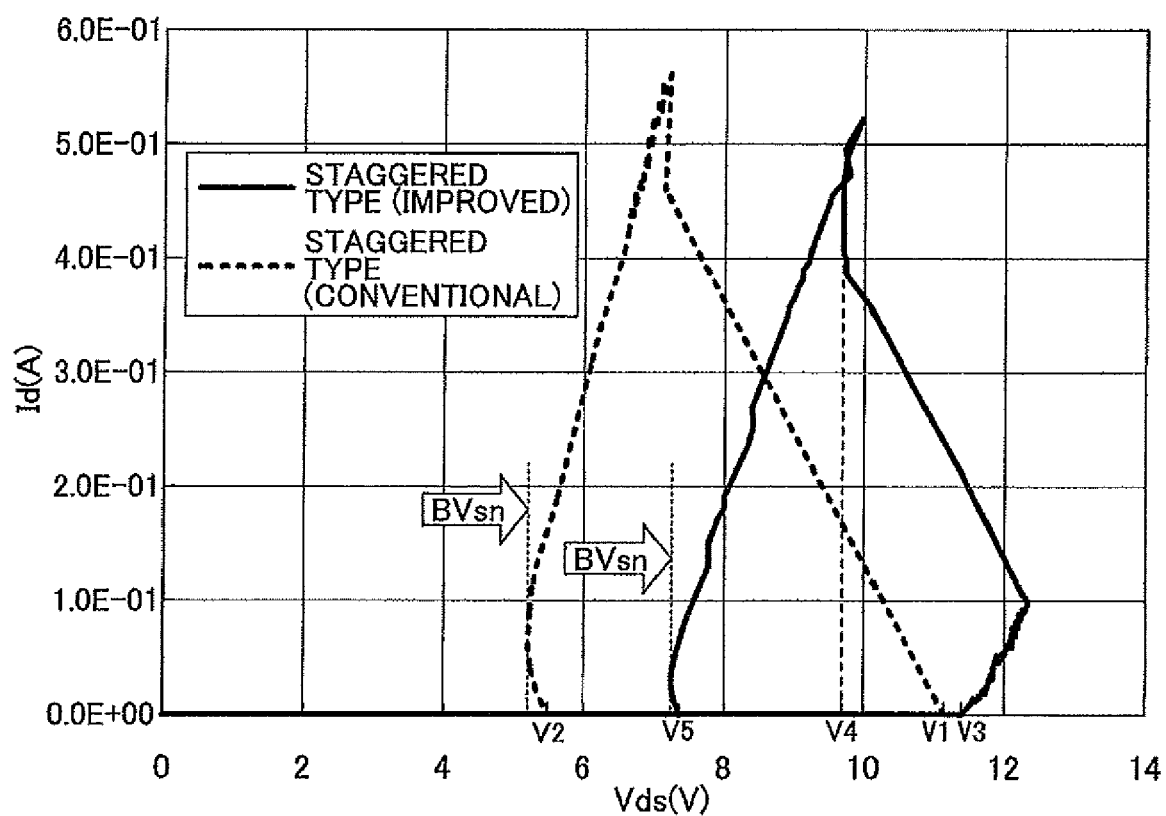
FIG. 6 shows snapback characteristics of a MOS transistor Tr of the present embodiment and a related art MOS transistor Tr1.

FIG. 6 is a drawing showing snapback characteristics of a related art transistor Tr1 (see FIG. 1) and a MOS transistor Tr of the present embodiment. In FIG. 6, the horizontal axis indicates the drain-source voltage Vds[V] between the drain D and the source S, and the vertical axis indicates the drain current Id [A]. FIG. 6 shows snapback characteristics of an N-channel MOS transistor in units of gate width W per gate length L, W/L=30400 [µm]/1.3 [µm].

In FIG. 6, the dashed line indicates the snapback characteristics of a related art MOS transistor Tr1, and the solid line indicates the snapback characteristics of the MOS transistor Tr of the present embodiment. For the related art MOS transistor Tr1 and the MOS transistor Tr of the present embodiment, the right side characteristics of both transistors at higher voltage indicate breakdown voltage characteristics causing the snapback phenomena when the voltage between the drain D-source S is gradually increased. The left side characteristics at lower voltage indicate the breakdown voltage characteristics when the voltage between the drain D-source S is gradually decreased after the snapback phenomena occur. Namely, the snapback characteristics show hysteresis characteristics in FIG. 6.

In a case of the related art MOS transistor Tr1, when the drain D-source S voltage Vds is gradually increased, a snapback phenomenon occurs at a voltage V1 slightly larger than the voltage of 11 V. Once the snapback occurs, the drain current Id keeps flowing and the snapback is maintained even if the drain D-source S voltage Vds is decreased. While the drain D-source S voltage Vds keeps decreasing and reaches a voltage around 7.5 V, near the voltage V5, the drain current Id starts decreasing. After that voltage, the drain current Id is decreased as the drain D-source S voltage Vds is decreased as shown in the left side slope (characteristic) of the dashed line. At the voltage V2 slightly greater than the voltage 5 V, the snapback phenomenon disappears and the MOS transistor Tr1 returns to a normal state.

On the other hand, for the MOS transistor Tr of the present embodiment, when the voltage Vds between the drain D-source S is gradually increased, the snapback occurs at a voltage V3 slightly greater than the voltage of 11 V. After that voltage, the drain current Id keeps increasing up to the voltage beyond 12 V as the voltage Vds between the drain D-source S is increased according to the snapback characteristics shown on the right side of the slope. At the voltage V4, slightly less than 10 V, after the voltage Vds between the drain D-source S has been gradually decreased, the snapback changes to the left side characteristics, and the drain current Id starts decreasing. After having started decreasing, the drain current Id decreases in proportion to the decrease of the voltage Vds between the drain D-source S, and the snapback phenomenon disappears when the voltage Vds reaches V5, which is slightly beyond 7 V.

As shown in FIG. 6, the voltages Vds between the drain D-source S causing the snapback phenomena of the related art MOS transistor Tr1 and the MOS transistor Tr of the present embodiment are V1 and V3 (V1<V3), which are approximately just beyond 11 V. The two breakdown voltages V1 and V3 causing the snapback phenomena are almost the same. This is because the voltage-causing the snapback is a phenomenon based on the fundamental physics of devices, which is independent of the layout of the drain D, the source S and the gate G of the transistor.

However, when comparing the two voltages at which the snapback phenomena of the two transistors disappear, the related art MOS transistor shows a voltage V2, which is approximately just beyond 5 V. On the other hand, the MOS transistor Tr of the present embodiment shows a voltage V5, which is approximately just beyond 7 V. Thus, it is found that the breakdown voltage of the MOS transistor Tr of the present embodiment is improved by about 2 V. This indicates that when the operation voltage of a MOS transistor is set around 6 V, the snapback state of the MOS transistor Tr of the present embodiment would disappear, while the snapback state of the related art MOS transistor Tr1 would remain.

In other words, for example, if the MOS transistor Tr of the present embodiment is applied to a power MOS transistor used as a power supply circuit or the like, the snapback state will occur if a noise enters the circuit and a voltage of 14 V is applied between the drain D-source S. When the voltage Vds between the drain D-source S is reduced (or the voltage Vds between the drain D-source S drops) to a voltage V5, approximately 7 V, the MOS transistor Tr will recover to a normal operation state from the snapback state. Therefore, when the operation voltage is 6 V, the MOS transistor Tr of the present embodiment returns to a normal operation state.

On the other hand, for the related art MOS transistor Tr1, if the operation voltage is 6 V, the related art MOS transistor Tr1 would still remain under the snapback state, and thus the operation cannot recover to a normal operation state from the snapback state.

Accordingly, the breakdown voltage characteristics of the MOS transistor Tr can be improved by increasing the breakdown voltage which causes the snapback state to return to a normal operation state. Further, as described in FIG. 5, the operation speed of the MOS transistor Tr is not reduced because the gate length L is not increased, and thus the high speed operation can be performed.

Further, a transistor circuit having a predetermined function can be provided by forming a MOS transistor Tr of the present embodiment in a semiconductor substrate WF and by incorporating the MOS transistor Tr in the circuit. Further, such a transistor circuit can be provided in the semiconductor substrate WF which is used to form a semiconductor chip. A semiconductor integrated circuit apparatus can be manufactured by including the semiconductor chip in a package by using a packaging technique. In this way, the semiconductor integrated circuit apparatus can achieve improved breakdown characteristics while maintaining high speed operation.

As described above, the back gate can be arranged not only at both sides or peripheral parts of the MOS transistor but also on the central part of the MOS transistor, so that the substrate current of the parasitic transistor can be collected in a shorter current path, which can suppress elevation of the potential due to the parasitic resistance. Thus, the parasitic transistor operation can be suppressed, which makes it possible for the MOS transistor to improve the breakdown voltage characteristics and to achieve high speed operation.

According to the present invention, for a MOS transistor, the breakdown voltage characteristic is improved and high speed operation can be achieved.

Although the invention has been described with respect to a specific embodiment for a complete and clear disclosure, the appended claims are not to be thus limited but are to be construed as embodying all modifications and alternative constructions that may occur to one skilled in the art that fairly fall within the basic teachings herein set forth.

This patent application is based on Japanese Priority Patent Application No. 2007-340832 filed on Dec. 28, 2007, the entire contents of which are hereby incorporated by reference.

What is claimed is:

1. A MOS transistor comprising:
plural transistor cell blocks arranged adjacently in parallel to one another,
wherein the plural transistor cell blocks are configured to have plural transistor cells, plural boundaries that are parallel to the plural transistor cells, and plural back gates arranged at the plural boundaries, each of the plural transistor cell blocks has two boundaries of the plural boundaries,
wherein the plural transistor cells have a substantially striped shape, and each of the plural transistor cell blocks includes:
at least one drain;
plural sources; and
plural extended gates,
wherein each of the plural transistor cells is formed from one of the plural extended gates sandwiched between one of said at least one drain and one of the plural sources, one of the plural sources is adjacent to one of said two boundaries, and another one of the plural sources is adjacent to another one of said two boundaries.

2. The MOS transistor as claimed in claim 1, further comprising a pair of surrounding back gates,
wherein each of the plural back gates has a first end and a second end, one of the surrounding back gates connects all the first ends of the plural back gates, and another one of the surrounding back gates connects all the second ends of the plural back gates so that each of the plural transistor cell blocks is surrounded by the plural back gates and the pair of the back gates.

3. The MOS transistor as claimed in claim 1, wherein each of the plural transistor cell blocks includes the same number of the plural transistor cells.

4. The MOS transistor as claimed in claim 1, wherein at least one of the plural transistor cell blocks is configured to include only two of the plural transistor cells.

5. The MOS transistor as claimed in claim 1, wherein the plural sources and the plural back gates are commonly connected to a ground.

6. A semiconductor integrated circuit comprising:
a transistor circuit formed from at least one MOS transistor of claim 1;
wherein the transistor circuit is formed on a semiconductor substrates and the semiconductor substrate is packaged in a package.

* * * * *